United States Patent
Otsuki et al.

(10) Patent No.: US 11,626,330 B2
(45) Date of Patent: Apr. 11, 2023

(54) FILM FORMING METHOD AND FILM FORMING APPARATUS

(71) Applicant: Tokyo Electron Limited, Tokyo (JP)

(72) Inventors: Yuji Otsuki, Nirasaki (JP); Munehito Kagaya, Nirasaki (JP); Yusuke Suzuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 5 days.

(21) Appl. No.: 17/303,920

(22) Filed: Jun. 10, 2021

(65) Prior Publication Data
US 2021/0398863 A1    Dec. 23, 2021

(30) Foreign Application Priority Data
Jun. 17, 2020   (JP) .............................. JP2020-104779

(51) Int. Cl.
| | |
|---|---|
| *G01N 21/35* | (2014.01) |
| *H01L 21/66* | (2006.01) |
| *G01N 21/3563* | (2014.01) |
| *G01N 21/84* | (2006.01) |

(52) U.S. Cl.
CPC ......... *H01L 22/12* (2013.01); *G01N 21/3563* (2013.01); *G01N 21/8422* (2013.01); *H01L 22/26* (2013.01); *G01N 2021/3568* (2013.01); *G01N 2021/3595* (2013.01)

(58) Field of Classification Search
CPC ..... H01L 22/12; H01L 22/26; G01N 21/3563; G01N 21/8422
See application file for complete search history.

(56) References Cited

U.S. PATENT DOCUMENTS

| | | | | |
|---|---|---|---|---|
| 2004/0023403 A1* | 2/2004 | Tatsunari | ............... | G01N 21/35 436/144 |
| 2005/0118735 A1* | 6/2005 | Mantz | .................... | G01B 11/22 438/5 |
| 2011/0074013 A1* | 3/2011 | Ueda | ...................... | C23C 16/402 423/325 |
| 2020/0388546 A1* | 12/2020 | Horikiri | .............. | H01L 21/0254 |

FOREIGN PATENT DOCUMENTS

JP   H10-056010 A   2/1998

OTHER PUBLICATIONS

Otsuki et al., "Infrared Spectroscopy of SiNx Grown by Atomic Layer Deposition on Structured Substrates", 20th International Conference on Atomic Layer Deposition (ALD 2020), Jun. 29 to Jul. 1, 2020, AF-MoP: ALD Fundamentals Poster Session, 1 page.

* cited by examiner

*Primary Examiner* — Hugh Maupin
(74) *Attorney, Agent, or Firm* — Armstrong Teasdale LLP

(57) ABSTRACT

A film forming method includes: a first measurement process of measuring a substrate on which a pattern including recesses is formed using infrared spectroscopy; a film formation process of forming a film on the substrate after the first measurement process; a second measurement process of measuring the substrate using infrared spectroscopy after the film formation process; and an extraction process of extracting difference data between measurement data obtained in the first measurement process and measurement data obtained in the second measurement process.

13 Claims, 12 Drawing Sheets

FILM FORMING METHOD AND FILM FORMING APPARATUS

CROSS-REFERENCE TO RELATED APPLICATION

This application is based upon and claims the benefit of priority from Japanese Patent Application No. 2020-104779, filed on Jun. 17, 2020, the entire contents of which are incorporated herein by reference.

TECHNICAL FIELD

The present disclosure relates to a film forming method and a film forming apparatus.

BACKGROUND

Patent Document 1 discloses a technique in which a substrate for film formation and a substrate for monitoring are placed to form films thereon, the film formed on the substrate for monitoring is analyzed using infrared spectroscopy, and quality of the film formed on the substrate for film formation is optimized based on the analysis value.

PRIOR ART DOCUMENT

[Patent Document]
Patent Document 1: Japanese Laid-Open Patent Publication No. 10-56010

SUMMARY

A film forming method according to an aspect of the present disclosure includes a first measurement process, a film formation process, a second measurement process, and an extraction process. In the first measurement process, a substrate on which a pattern including recesses is formed is measured using infrared spectroscopy. In the film formation process, a film is formed on the substrate after the first measurement process. In the second measurement process, the substrate is measured using infrared spectroscopy after the film formation process. In the extraction process, difference data between measurement data obtained in the first measurement process and measurement data obtained in the second measurement process is extracted.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a film forming method and a film forming apparatus disclosed herein will be described in detail with reference to the drawings. The film forming method and the film forming apparatus disclosed herein are not limited by the embodiments.

In manufacturing semiconductor devices, a film is formed on a substrate, such as a semiconductor wafer on which a pattern including recesses is formed, by a film forming apparatus. The film forming apparatus forms a film on the substrate by disposing the substrate inside a chamber (a processing container) having a predetermined degree of vacuum, and generating plasma while supplying a source gas for film formation into the chamber. As examples of a film forming technique, a plasma chemical vapor deposition (CVD) method and a plasma atomic layer deposition (ALD) method are known.

Due to the progress of miniaturization of patterns formed on substrates, in the film formation using plasma, quality of a film formed on side walls and bottoms of the recesses included in a pattern deteriorates easily. Thus, in addition to an actual substrate on which semiconductor devices are manufactured, a film is formed on a flat substrate for monitoring and the film formed on the substrate for monitoring is analyzed using infrared spectroscopy, thereby inferring a state of a film formed on the actual substrate.

However, since the state of the film formed on the actual substrate is different from a state of the film formed on the substrate for monitoring, even when the film formed on the substrate for monitoring is analyzed using infrared spectroscopy, the state of the film formed on the actual substrate cannot be obtained.

Therefore, a technique for detecting a state of a film formed on a substrate on which a pattern including recesses is formed is desired.

Embodiments

[Configuration of Film Forming Apparatus]

Figure 1:
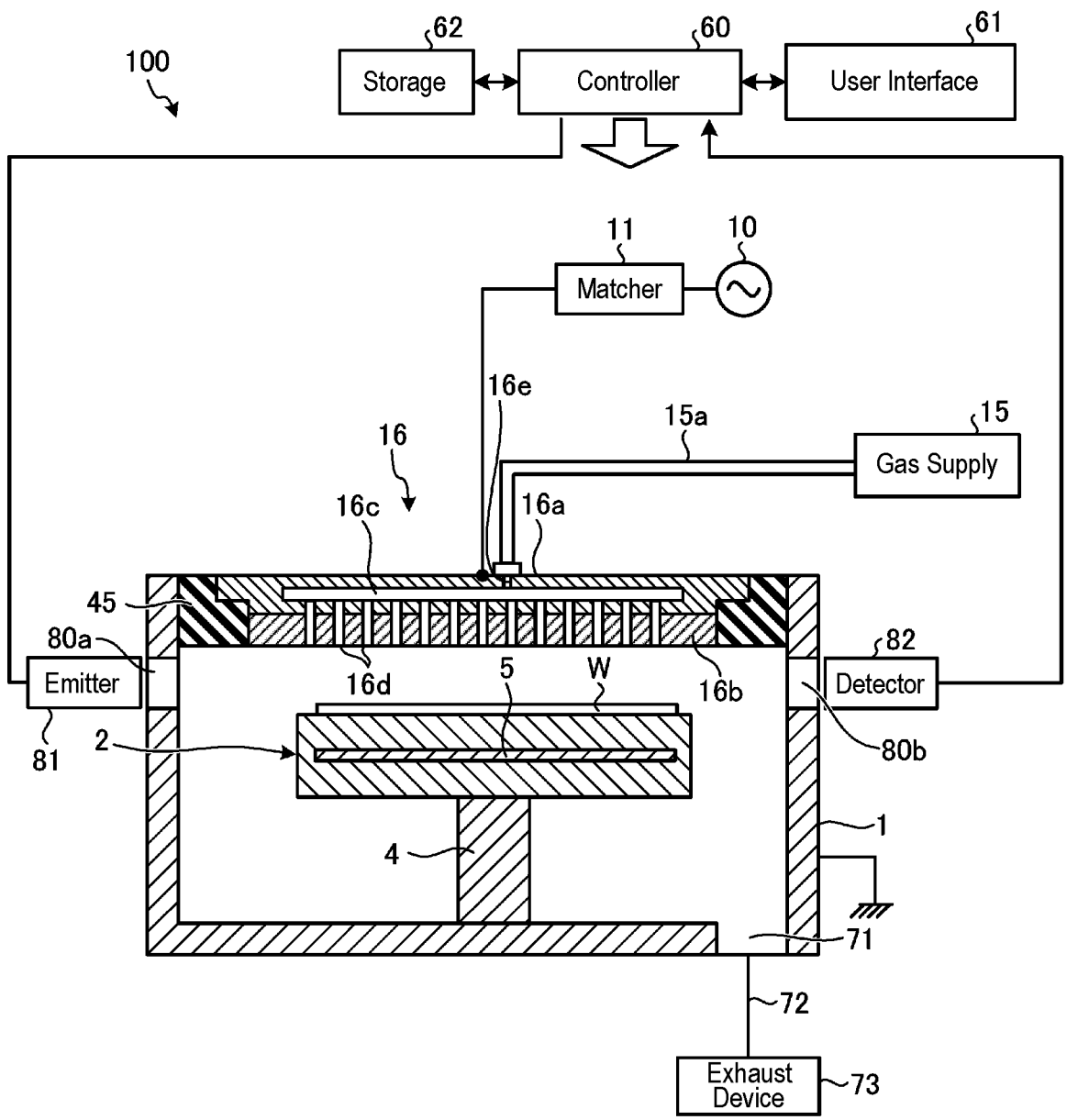
FIG. 1 is a schematic cross-sectional view illustrating an exemplary film forming apparatus according to an embodiment.

Next, an embodiment will be described. First, a film forming apparatus 100 according to an embodiment will be described. FIG. 1 is a schematic cross-sectional view illustrating an example of a schematic configuration of the film forming apparatus 100 according to an embodiment. In the embodiment, the film forming apparatus 100 forms a film on a substrate W. The film forming apparatus 100 illustrated in FIG. 1 includes a chamber 1 hermetically configured and having an electrical ground potential. The chamber 1 has a cylindrical shape, and is formed of, for example, aluminum or nickel having an anodized film formed on a surface thereof. A stage 2 is provided in the chamber 1.

The stage 2 is formed of a metal such as aluminum or nickel. The substrate W such as a semiconductor wafer is placed on a top surface of the stage 2. The stage 2 horizontally supports the substrate W placed thereon. A bottom surface of the stage 2 is electrically connected to a support 4 formed of a conductive material. The stage 2 is supported by the support 4. The support 4 is supported on a bottom surface of the chamber 1. A lower end of the support 4 is electrically connected to the bottom surface of the chamber 1 and is grounded via the chamber 1. The lower end of the support 4 may be electrically connected to the bottom surface of the chamber 1 via a circuit that is adjusted to reduce an impedance between the stage 2 and the ground potential.

A heater 5 may be embedded in the stage 2 such that the substrate W placed on the stage 2 can be heated to a predetermined temperature. A flow path (not illustrated) for circulating a coolant therein may be formed in the stage 2, and a coolant having a temperature controlled by a chiller unit provided outside the chamber 1 may be supplied into and circulated in the flow path. The stage 2 may control the substrate W to a predetermined temperature by heating with the heater 5 and cooling with the coolant supplied from the chiller unit. A temperature of the stage 2 may be controlled only by the coolant supplied from the chiller unit without providing the heater 5.

An electrode may be embedded in the stage 2. The stage 2 may attract the substrate W placed on the top surface thereof by an electrostatic force generated by a DC voltage supplied to the electrode. In addition, the stage 2 is provided with lifting pins (not illustrated) for delivering the substrate W to and from a transfer mechanism (not illustrated) provided outside the chamber 1.

A substantially disk-shaped shower head 16 is provided on an inner surface of the chamber 1 above the stage 2. The shower head 16 is supported above the stage 2 via an insulator 45 such as ceramic. Thus, the chamber 1 and the shower head 16 are electrically isolated from each other. The shower head 16 is formed of a conductive metal such as nickel.

The shower head 16 has a ceiling plate 16*a* and a shower plate 16*b*. The ceiling plate 16*a* is provided so as to close the interior of the chamber 1 from above. The shower plate 16*b* is provided below the ceiling plate 16*a* and faces the stage 2. A gas diffusion space 16*c* is formed in the ceiling plate 16*a*. A plurality of gas ejection holes 16*d* that are opened toward the gas diffusion space 16*c* is formed by being dispersed in the ceiling plate 16*a* and the shower plate 16*b*.

The ceiling plate 16*a* has a gas inlet 16*e* configured to introduce various types of gases into the gas diffusion space 16*c*. A gas supply path 15*a* is connected to the gas inlet 16*e*. A gas supply 15 is connected to the gas supply path 15*a*.

The gas supply 15 includes gas supply lines respectively connected to gas sources of various types of gases used for film formation. Each gas supply line is appropriately branched according to a film forming process, and is provided with control devices for controlling a gas flow rate, such as a valve (e.g., an opening and closing valve) and a flow rate controller (e.g., a mass flow controller). The gas supply 15 can control flow rates of various types of gases by controlling the control devices such as the opening and closing valve and the flow rate controller provided in each gas supply line.

The gas supply 15 supplies various types of gases used for film formation to the gas supply path 15*a*. For example, the gas supply 15 supplies a source gas for film formation to the gas supply path 15*a*. In addition, the gas supply 15 supplies a purge gas or a reaction gas that reacts with the source gas to the gas supply path 15*a*. The gas supplied to the gas supply path 15*a* is diffused in the gas diffusion space 16*c* and ejected from the gas ejection holes 16*d*.

A space surrounded by a bottom surface of the shower plate 16*b* and the top surface of the stage 2 forms a processing space in which the film forming process is performed. In addition, the shower plate 16*b* is configured as an electrode plate that is paired with the stage 2 grounded via the support 4 and the chamber 1 to form capacitively coupled plasma (CCP) in the processing space. A radio frequency power supply 10 is connected to the shower head 16 via a matcher 11, and radio frequency (RF) power is supplied from the radio frequency power supply 10 to the gas supplied to a processing space 40 via the shower head 16, thereby forming the CCP. The radio frequency power supply 10 may be connected to the stage 2 instead of being connected to the shower head 16 so that the shower head 16 is grounded. In the present embodiment, the shower head 16, the gas supply 15, the radio frequency power supply 10, and the like, which perform the film forming process, correspond to a film forming part of the present disclosure.

An exhaust port 71 is formed in the bottom of the chamber 1, and an exhaust device 73 is connected to the exhaust port 71 via an exhaust pipe 72. The exhaust device 73 includes a vacuum pump and a pressure adjusting valve, and is configured to be capable of depressurizing and adjusting the interior of the chamber 1 to a predetermined degree of vacuum by operating the vacuum pump and the pressure adjusting valve.

Windows 80*a* and 80*b* are provided on a side wall of the chamber 1 at locations facing each other across the stage 2. A member that is transparent to infrared light, such as quartz, is inserted in each of the windows 80*a* and 80*b* in a sealed state. An emitter 81 configured to emit infrared light is provided outside the window 80*a*. A detector 82 capable of detecting infrared light is provided outside the window 80*b*. Positions of the window 80*a* and the emitter 81 are adjusted so that the infrared light emitted from the emitter 81 is emitted to the substrate W via the window 80*a*. In addition, positions of the window 80*b* and the detector 82 are adjusted such that the infrared light reflected by the substrate W enters the detector 82 via the window 80*b*. A loading and unloading port (not illustrate) for loading and unloading the substrate W is provided at a portion in the side wall of the chamber 1 other than portions where the windows 80*a* and 80b are provided. The loading and unloading port is provided with a gate valve that opens and closes the loading and unloading port.

The emitter 81 is disposed such that infrared light emitted therefrom reaches a predetermined region in the vicinity of a center of the substrate W via the window 80a. For example, the emitter 81 emits the infrared light to a region having a range of about 1 to 10 mm from the center of the substrate W. The detector 82 is disposed such that the infrared light reflected from the predetermined region of the substrate W is incident thereon via the window 80b.

The film forming apparatus 100 according to the present embodiment obtains absorbance at each wavenumber of the infrared light reflected by the substrate W using infrared spectroscopy (IR), thereby detecting a state of a film formed on the substrate W. Specifically, the film forming apparatus 100 obtains the absorbance at each wavenumber of the reflected infrared light using Fourier transform infrared spectroscopy (FT-IR), thereby detecting substances contained in the film formed on the substrate W.

The emitter 81 includes therein a light source that emits infrared light and optical elements such as a mirror and a lens, and can emit interfered infrared light. For example, the emitter 81 divides an intermediate portion of an optical path, via which the infrared light generated by the light source is emitted to the outside, into two optical paths by using a half mirror or the like, and changes a length of one optical path with respect to a length of the other optical path to change an optical path difference and cause interference, thereby emitting infrared light of various interference waves having different optical path differences. Alternatively, the emitter 81 may have a plurality of light sources and individually control infrared light of the light sources using optical devices to emit infrared light of various interference waves having different optical path differences.

The detector 82 detects signal intensities of infrared light of various interference waves reflected by the substrate W. In the present embodiment, components, such as the emitter 81 and the detector 82, that perform measurement using infrared spectroscopy correspond to a measurement part of the present disclosure.

Operations of the film forming apparatus 100 configured as described above are controlled overall by a controller 60. A user interface 61 and a storage 62 are connected to the controller 60.

The user interface 61 is configured by an operation part, such as a keyboard, via which a process manager inputs commands to manage the film forming apparatus 100, and a display part, such as a display, which visualizes and displays an operating state of the film forming apparatus 100. The user interface 61 receives various operations. For example, the user interface 61 receives a predetermined operation instructing a start of a plasma process.

The storage 62 stores programs (software) for implementing various processes performed in the film forming apparatus 100 under the control of the controller 60, or data such as processing conditions or process parameters. In addition, programs or data stored in a non-transitory computer-readable computer storage medium (e.g., a hard disk, a CD, a flexible disk, a semiconductor memory, or the like) may be used. Alternatively, the programs or data may be transmitted from another device at any time via, for example, a dedicated line so as to be used online.

The controller 60 is, for example, a computer including a processor, a memory, and the like. The controller 60 reads a program or data from the storage 62 based on instructions from the user interface 61 or the like and controls individual components of the film forming apparatus 100, thereby executing processes of a film forming method described later.

The controller 60 is connected to the emitter 81 and the detector 82 via an interface (not illustrated) for inputting and outputting data, and inputs and outputs various kinds of information. The controller 60 controls the emitter 81 and the detector 82. For example, the emitter 81 emits various interference waves having different optical path differences based on control information from the controller 60. In addition, the controller 60 inputs information on signal intensity of infrared light detected by the detector 82.

Figure 2:
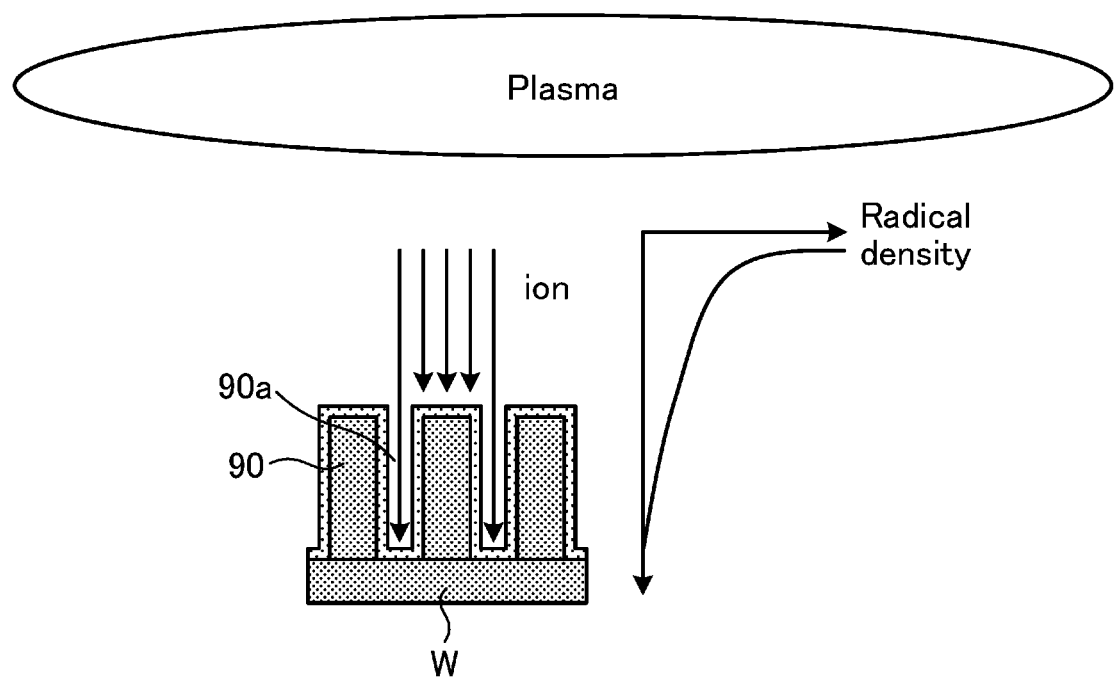
FIG. 2 is a view for explaining a film forming process using plasma according to an embodiment.

With the progress in miniaturization of semiconductor devices, a pattern formed on a substrate also has a complicated nanoscale shape. In a film forming process using plasma, quality of a film formed on side walls and bottoms of recesses included in such a nanoscale fine pattern deteriorates easily. FIG. 2 is a view for explaining a film forming process using plasma according to an embodiment. In FIG. 2, the substrate W is illustrated. A pattern 90 including nanoscale recesses 90a is formed on the substrate W. In the film forming process using plasma, it is difficult for ions and radicals to reach side walls and bottoms of the recesses 90a. Thus, quality of a film on the side walls and bottoms of the recesses 90a deteriorates easily. In order to improve the film quality, it is necessary to analyze a composition of the film on the side walls and bottoms of the recesses 90a.

Examples of a technique for analyzing a film that has been formed may include energy dispersive X-ray spectroscopy such as TEM-EDX and infrared spectroscopy such as Fourier transform infrared spectroscopy (FT-IR).

Figure 3A:
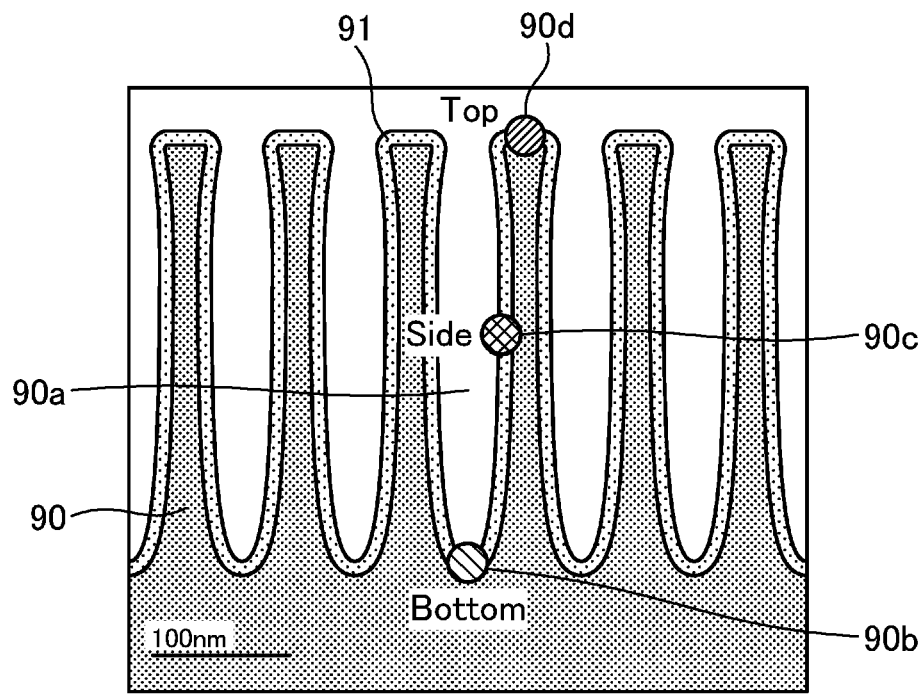
FIG. 3A is a view for explaining an analysis using TEM-EDX.
Figure 3B:
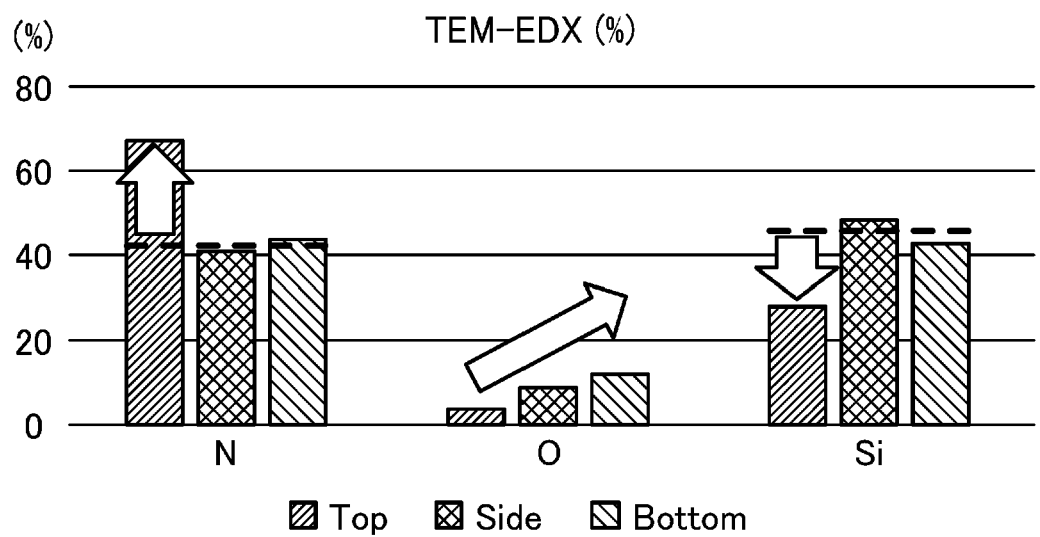
FIG. 3B is a view for explaining an analysis using TEM-EDX.

FIGS. 3A and 3B are views for explaining analysis using TEM-EDX. FIG. 3A schematically illustrates a state in which a SiN film 91 is formed on the pattern 90 having the recesses 90a through a plasma ALD method. Portions of the SiN film 91 formed on bottoms 90b ("Bottom") and sidewalls 90c ("Side") of the recesses 90a, and top surfaces 90d ("Top") of the pattern 90, respectively, were analyzed using TEM-EDX. FIG. 3B shows an example of results obtained by analyzing the portions of the SiN film 91 formed on the bottoms 90b ("Bottom"), the sidewalls 90c ("Side"), and the top surfaces 90d ("Top"), respectively, using TEM-EDX. With TEM-EDX, elemental compositions of the SiN film 91 can be determined.

FIG. 3B shows proportions of N (nitrogen), O (oxygen), and Si (silicon) at the bottoms 90b ("Bottom"), the sidewalls 90c ("Side"), and the top surfaces 90d ("Top"), respectively. The proportion of N is higher at the top surfaces 90d than at the bottoms 90b and the sidewalls 90c. In addition, the proportion of O increases in the order of the top surfaces 90d, the sidewalls 90c, and the bottoms 90b. Furthermore, the proportion of Si is lower at the top surfaces 90d than at the bottoms 90b and the sidewalls 90c. From this result, it was found that a more detailed analysis is necessary because the elemental compositions vary among the bottoms 90b, the sidewalls 90c, and the top surfaces 90d. However, when using TEM-EDX, although elements can be detected, chemical bonds cannot be detected. For example, whether N is bonded to O or Si cannot be determined. In addition, in an analysis using TEM-EDX, light atoms such as H (hydrogen) or the like cannot be detected.

Figure 4:
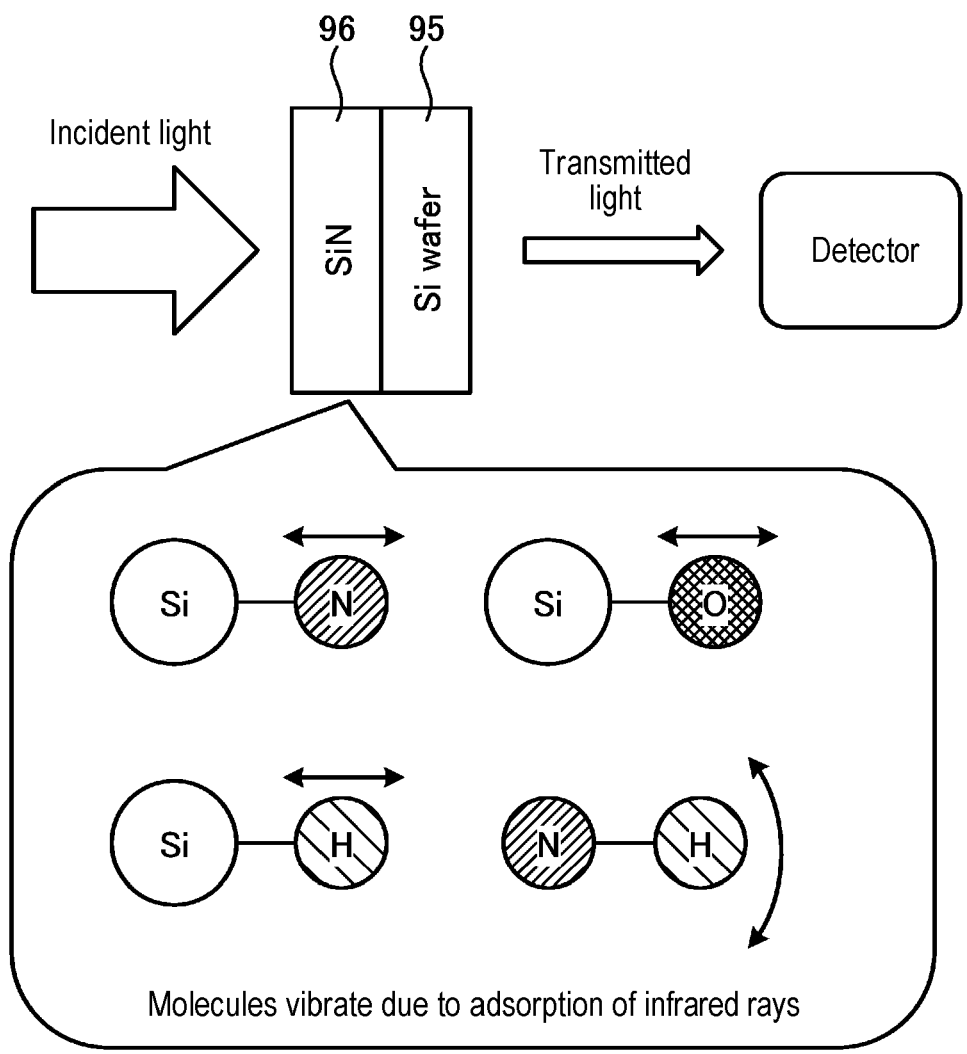
FIG. 4 is a view for explaining an FT-IR analysis in the related art.

FIG. 4 is a view for explaining an FT-IR analysis in the related art. In an FT-IR analysis in the related art, in addition to an actual substrate on which semiconductor devices are manufactured, a film is formed on a flat substrate for monitoring purposes. In addition, infrared light is emitted to the substrate for monitoring purposes, and the infrared light transmitted through or reflected from the substrate for monitoring purposes is analyzed, thereby inferring a state of a film formed on the actual substrate W. FIG. 4 schematically illustrates a state in which a SiN film 96 is formed on a flat silicon substrate 95 for monitoring using a plasma ALD method. In FIG. 4, infrared light is emitted to the silicon substrate 95, and the light transmitted through the silicon substrate 95 is detected by a detector, thereby performing an FT-IR analysis. In the FT-IR analysis, it is possible to obtain information on chemical bonds. Further, in the FT-IR analysis, it is possible to observe vibration of hydrogen atoms, and thus it is possible to detect light atoms such as hydrogen or the like. For example, since the SiN film 96 absorbs infrared light and molecules thereof vibrate, it is possible to detect chemical bonds such as SiN, SiO, SiH, and NH through the FT-IR analysis.

However, there is a difference between the state of the film formed on the actual substrate W for manufacturing semiconductor devices and the state of the film formed on the silicon substrate 95 for monitoring. Thus, even when the SiN film 96 formed on the silicon substrate 95 is analyzed using infrared spectroscopy, the state of the SiN film 91 formed on the substrate W cannot be determined.

Therefore, in the film forming apparatus 100 according to the embodiment, the controller 60 controls individual components to perform processing of the film forming method described below to analyze a composition of a film formed on the substrate W.

Figure 5:
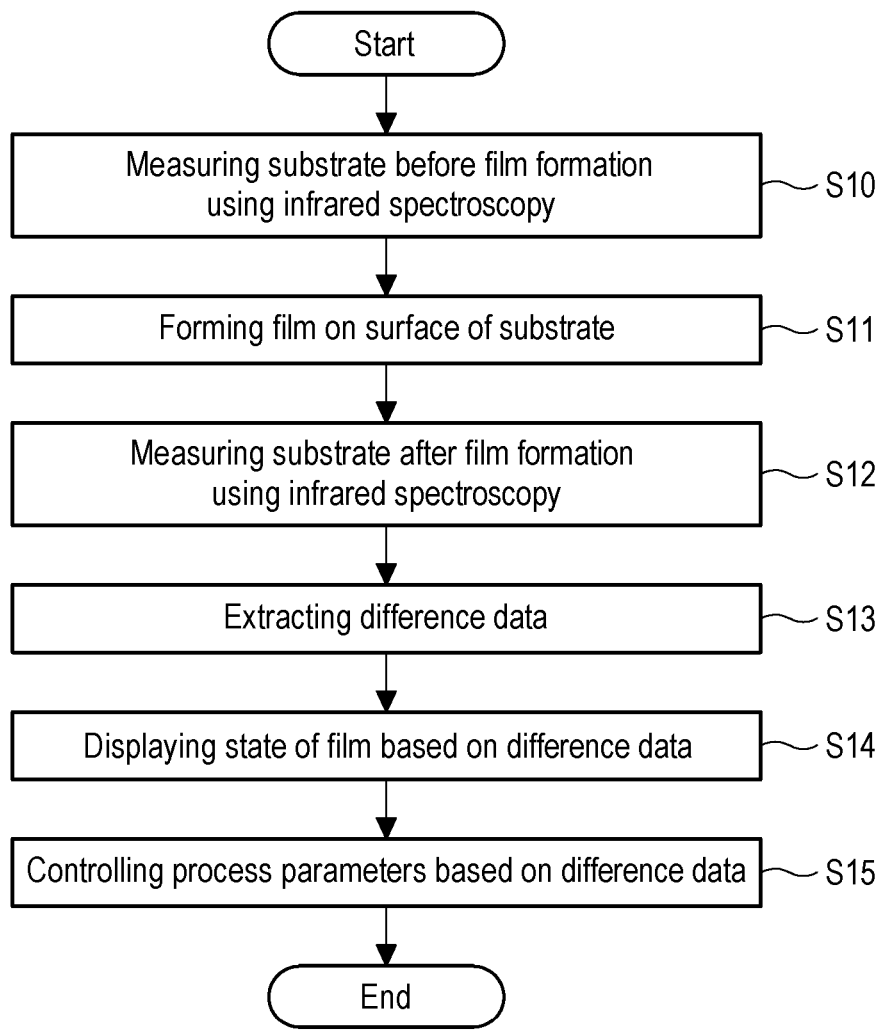
FIG. 5 is a view for explaining a flow of a film forming method according to an embodiment.

FIG. 5 is a view illustrating a flow of a film forming method according to an embodiment. First, a substrate before film formation, on which a pattern including recesses is formed, is measured using infrared spectroscopy (step S10). For example, a substrate W, which is a film formation target and has a pattern including recesses 90a formed on a surface thereof, is placed on the stage 2. In the film forming apparatus 100, the controller 60 controls the emitter 81 to emit infrared light to the substrate W before film formation, and the infrared light reflected from the substrate W is detected by the detector 82, whereby the controller 60 performs an FT-IR analysis.

Subsequently, a film is formed on the substrate using plasma, for example, through a plasma CVD method or a plasma ALD method (step S11). For example, the controller 60 controls the gas supply 15 and the radio frequency power supply 10 to form the SiN film 91 on the surface of the substrate W through a plasma ALD method.

Subsequently, the substrate after film formation is measured using infrared spectroscopy (step S12). For example, in the film forming apparatus 100, the controller 60 controls the emitter 81 to emit infrared light to the substrate W after film formation, and the infrared light reflected from the substrate W is detected by the detector 82, whereby the controller 60 performs an FT-IR analysis.

Figure 6:
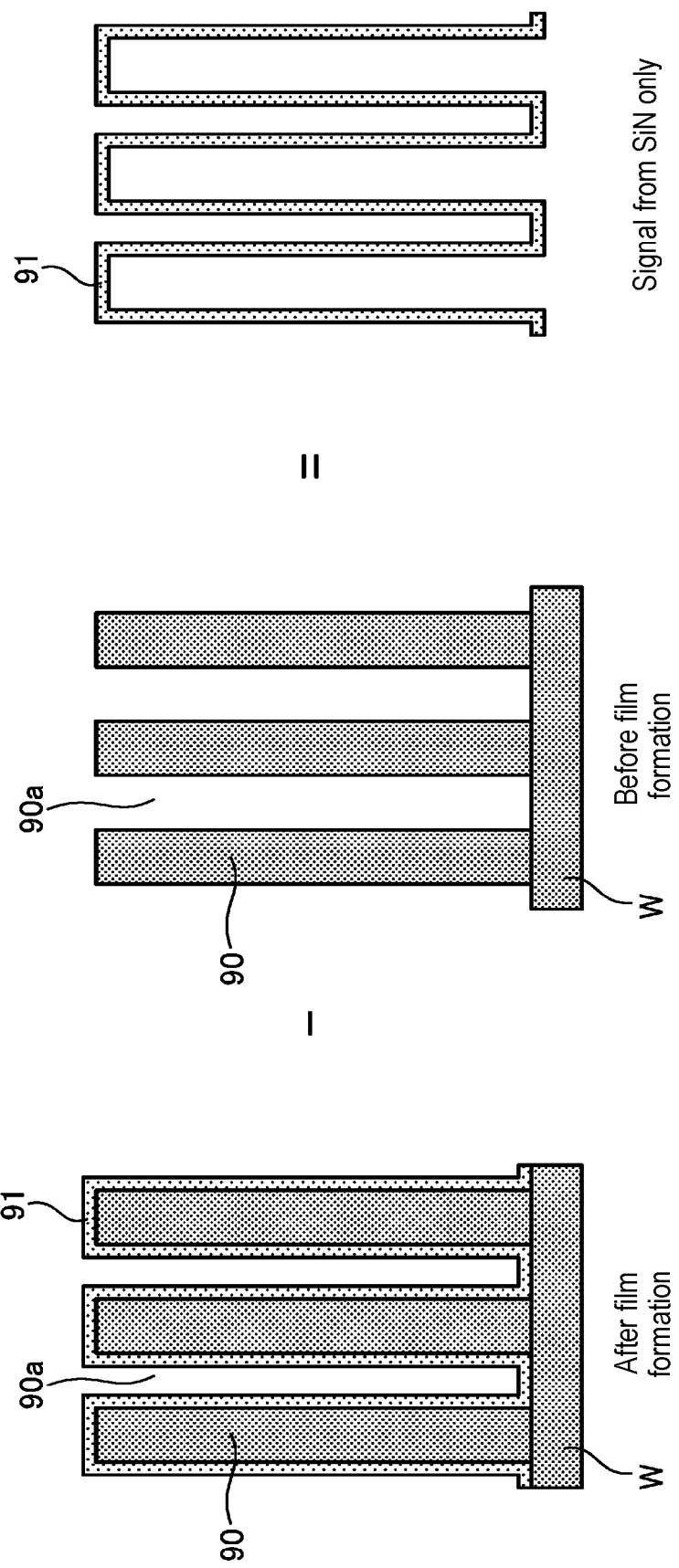
FIG. 6 is a view for explaining difference data according to an embodiment.

Subsequently, difference data between measurement data measured in step S10 and measurement data measured in step S12 is extracted (step S13). For example, the controller 60 extracts the difference data between the measurement data before the film formation and the measurement data after the film formation. FIG. 6 is a view for explaining the difference data according to an embodiment. FIG. 6 illustrates the substrate W on which the pattern 90 including the recesses 90a is formed, as a substrate "Before film formation." In addition, the substrate W on which the SiN film 91 is formed on the pattern 90 is illustrated as a substrate "After film formation." By extracting, from measurement data after film formation, a difference between measurement data before the film formation and measurement data after the film formation, a signal of the SiN film 91 as difference data can be extracted.

Subsequently, the state of the film formed on the substrate W is displayed based on the extracted difference data (step S14). For example, the controller 60 detects chemical bonds contained in the SiN film 91 based on the difference data, and displays the detected chemical bonds on the user interface 61.

In addition, process parameters for film formation are controlled based on the extracted difference data (step S15). For example, the controller 60 detects the chemical bonds contained in the SiN film 91 based on the difference data, and controls the process parameters according to the detected chemical bonds.

Figure 7:
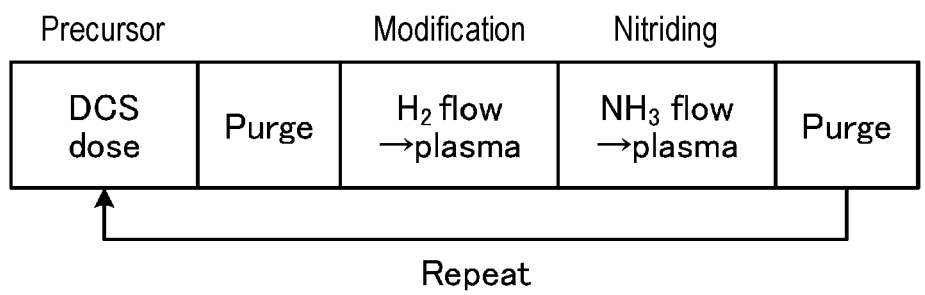
FIG. 7 is a view illustrating exemplary processes of a plasma ALD method according to an embodiment.

Here, a specific example of a detection result will be described. The SiN film 91 was formed on the substrate W having the pattern 90 including the recesses 90a formed thereon, through the film forming method according to the embodiment using a plasma ALD method. FIG. 7 is a view illustrating exemplary processes of a plasma ALD method according to an embodiment. In the plasma ALD method, first, a dichlorosilane (DCS: $SiH_2Cl_2$) gas is supplied such that a precursor is adsorbed on the substrate W, and then the DCS gas is purged. Subsequently, a modification process is performed by supplying RF power of 13 MHz while supplying a $H_2$ gas so as to generate plasma. Subsequently, a nitriding process is performed by supplying RF power of 13 MHz while supplying a $NH_3$ gas so as to generate plasma. In the plasma ALD method, a SiN film having a desired thickness is formed by repeating the processes described above.

Figure 8A:
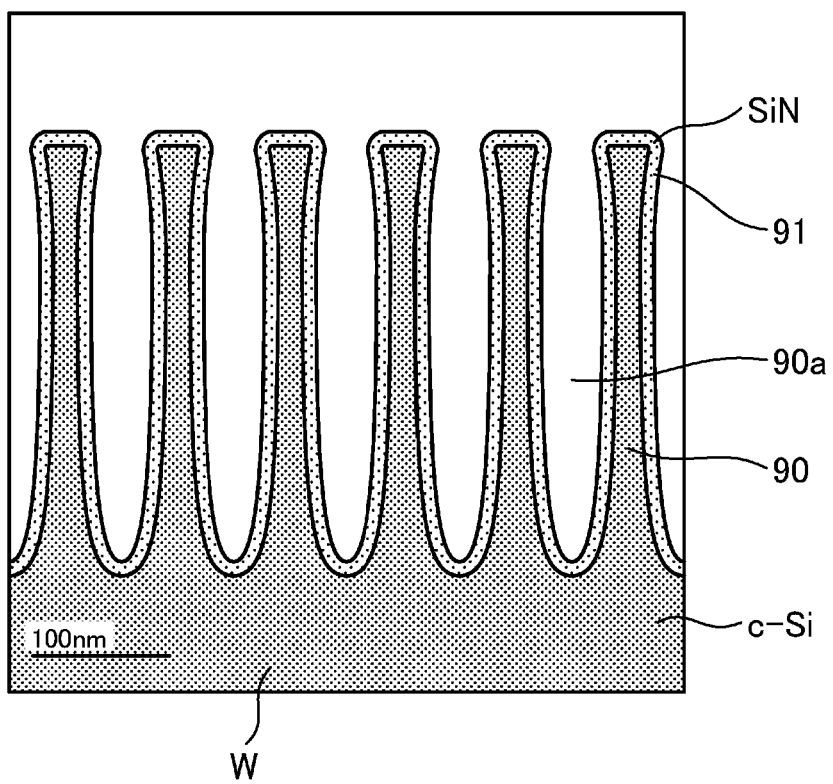
FIG. 8A is a view illustrating an exemplary substrate on which a SiN film is formed according to an embodiment.

FIG. 8A is a view illustrating an example of the substrate W on which the SiN film 91 is formed according to an embodiment. In the substrate W, the pattern 90 including the recesses 90a is formed in a single crystalline silicon (c-Si). In the pattern 90, an aspect ratio of a depth and a diameter of the recesses 90a is 8. The SiN film 91 is formed on the pattern 90 of the substrate W.

The controller 60 extracted difference data between the measurement data of the FT-IR analysis before film formation and the measurement data of the FT-IR analysis after film formation. For example, the controller 60 obtains absorbance of infrared light at each wavenumber of the infrared light from the measurement data before film formation and the measurement data after film formation. In addition, the controller 60 extracted, for each wavenumber, absorbance of infrared light by the SiN film 91 as difference data by subtracting the absorbance of infrared light before film formation from the absorbance of the infrared light after film formation for each wavenumber.

Figure 8B:
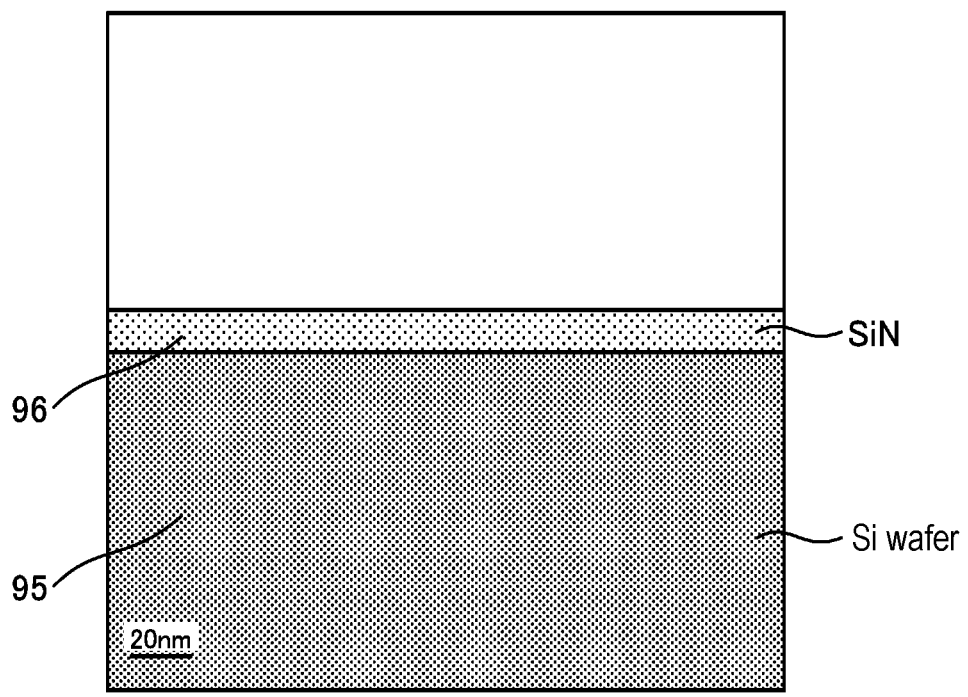
FIG. 8B is a view illustrating an exemplary silicon substrate on which a SiN film is formed according to a comparative example.

In addition, as a comparative example, a SiN film was formed on a flat silicon substrate through the film forming method according to an embodiment using a plasma ALD method. FIG. 8B is a view illustrating an example of the silicon substrate 95 on which the SiN film 96 was formed according to the comparative example. The silicon substrate 95 is a silicon wafer having a flat top surface, and the SiN film 96 was formed on the top surface. Similarly, in the comparative example, the controller 60 extracted difference data between the measurement data of the FT-IR analysis before film formation and the measurement data of the FT-IR analysis after film formation. For example, the controller 60 obtained absorbance of infrared light at each wavenumber of the infrared light from the measurement data before film formation and the measurement data after film formation. In addition, the controller 60 extracted, for each wavenumber, absorbance of infrared light by the SiN film 96 as difference data by subtracting the absorbance of infrared light before film formation from the absorbance of the infrared light after film formation for each wavenumber.

Figure 9:
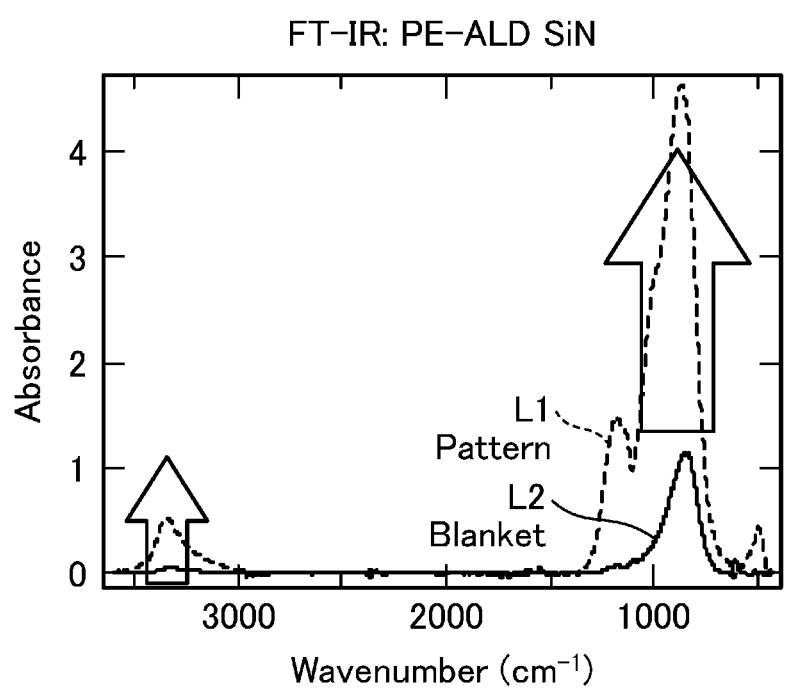
FIG. 9 is a view illustrating exemplary absorbance at each wavenumber of infrared light.

FIG. 9 is a view illustrating an exemplary absorbance of infrared light at each wavenumber. In FIG. 9, the horizontal axis represents a wavenumber of infrared light, and the vertical axis represents absorbance of infrared light. FIG. 9 shows a waveform L1 representing absorbance of the SiN film 91 formed on the pattern 90 of the substrate W for each wavenumber. Further, as a comparative example, a waveform L2 representing absorbance of the SiN film 96 formed on the flat silicon substrate 95 for each wavenumber is shown. A wavelength of infrared light decreases as a wavenumber thereof increases. In addition, a wavenumber of absorbed infrared light differs depending on a substance. Therefore, through an FT-IR analysis, substances contained in a formed film can be specified by wavenumbers of infrared light. In addition, through the FT-IR analysis, contents of the substances can be estimated from the absorbance at each wavenumber. Furthermore, through the FT-IR analysis, deposition (thickness) of the formed film can be estimated from the absorbance for each wavenumber.

As illustrated in FIGS. 8A and 8B, since the SiN film 91 is also formed on the sidewalls and the bottoms of the recesses 90a of the pattern 90, the SiN film 91 has a larger volume than the SiN film 96 formed on the flat silicon substrate 95. Therefore, the waveform L1 of the SiN film 91 has a higher absorbance than the waveform L2 of the SiN film 96. Compared with the waveform L2, the waveform L1 allows detecting even a weaker signal and thus allows detecting even a trace amount of a substance.

As the aspect ratio of the recesses 90a of the pattern 90 increases, the volume of the SiN film 91 formed on the sidewalls of the recesses 90a increases. Therefore, in the waveform L1, components on the sidewalls of the recesses 90a become dominant as the aspect ratio of the recesses 90a increases. That is, as the aspect ratio of the recesses 90a increases, the waveform L1 indicates a state of the sidewalls of the recesses 90a.

Figure 10A:
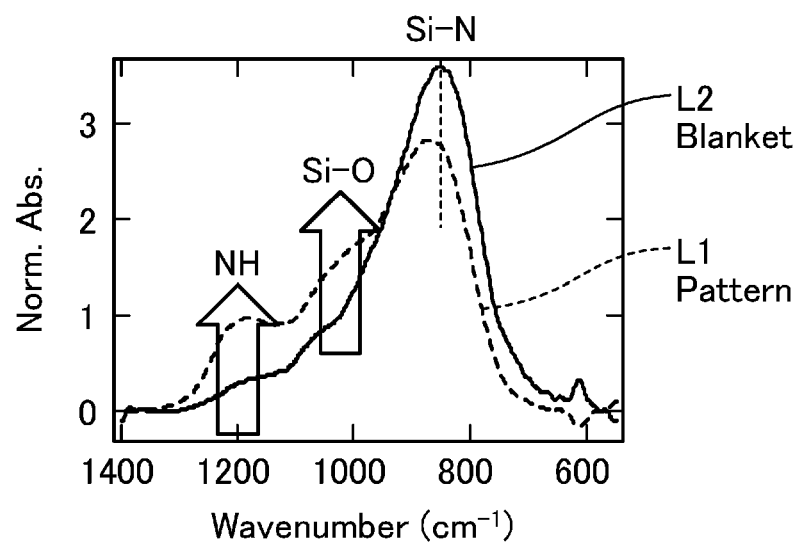
FIG. 10A is a view illustrating exemplary absorbance at each wavenumber of infrared light.
Figure 10B:
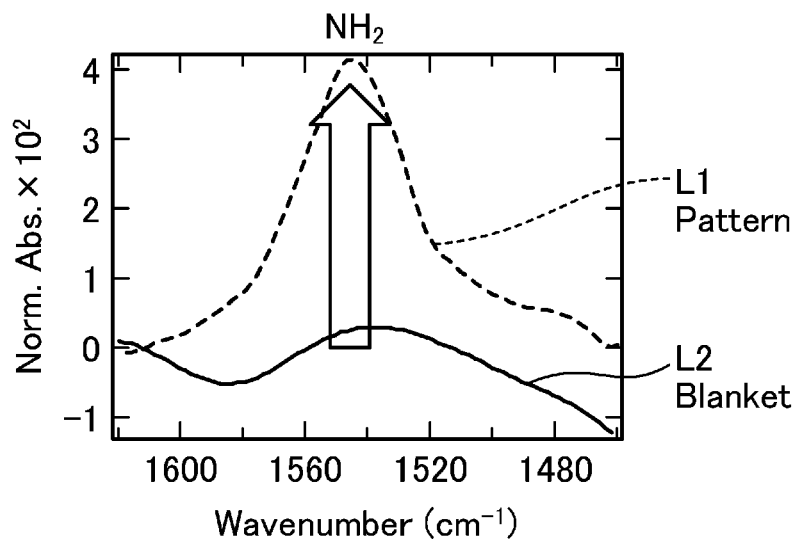
FIG. 10B is a view illustrating exemplary absorbance at each wavenumber of infrared light.
Figure 10C:
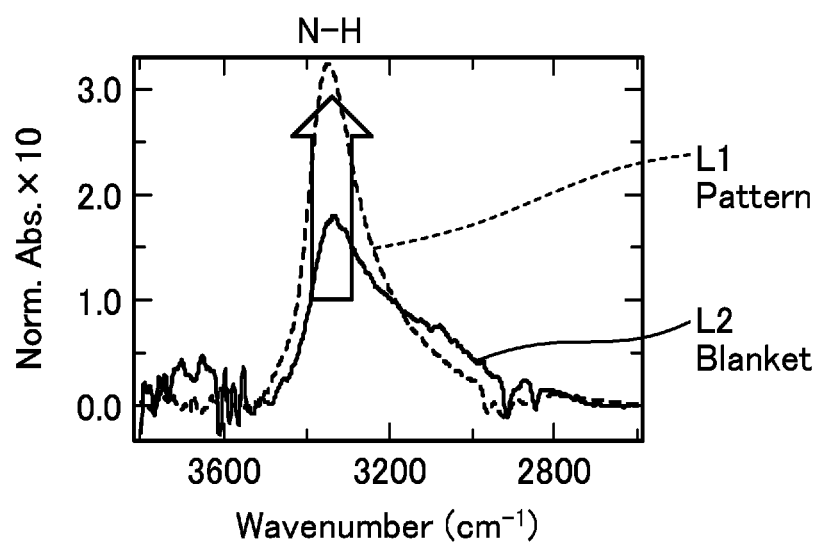
FIG. 10C is a view illustrating exemplary absorbance at each wavenumber of infrared light.

FIGS. 10A to 10C are views illustrating exemplary absorbance at each wavenumber of infrared light. In FIGS. 10A to 10C, the horizontal axis represents a wavenumber of infrared light, and the vertical axis represents absorbance of infrared light normalized by the area of a SiN film. Each of FIGS. 10A to 10C shows a waveform L1 representing absorbance of the SiN film 91 formed on the pattern 90 of the substrate W for each wavenumber, and the waveform L2 representing absorbance of the SiN film 96 formed on the flat silicon substrate 95 as a comparative example for each wavenumber. In addition, FIGS. 10A to 10C show locations of wavenumbers of infrared light to be absorbed for respective compounds or chemical bonds. As represented by the waveforms L1 and L2, the state of the SiN film 91 formed on the pattern 90 and the state of the SiN film 96 formed on the silicon substrate 95 are different from each other. For example, as shown in FIG. 10A, the absorbance of the waveform L2 is higher than that of the waveform L1 at the location of Si—N. In contrast, the absorbance of the waveform L1 is higher than that of the waveform L2 at the locations of Si—O and NH. Thus, in addition to Si—N, Si—O and NH are also contained in the SiN film 91 formed on the pattern 90. Further, as shown in FIG. 10B, the waveform L2 has small absorbance at the location of $NH_2$. In contrast, the waveform L1 has a large absorbance at the location of $NH_2$. Thus, $NH_2$ is also contained in the SiN film 91 formed on the pattern 90. Furthermore, as shown in FIG. 10C, the waveform L1 has larger absorbance at the location of N—H than that of the waveform L2. Thus, the SiN film 91 formed on the pattern 90 contains a large amount of N—H. As described above, the state of the SiN film 91 formed on the substrate W having the pattern 90 formed thereon and the state of the SiN film 96 formed on the flat silicon substrate 95 are different from each other. For example, in the case of FIGS. 10A to 10C, a large amount of NH is present in the SiN film 91, and SiO and $NH_2$ are present in the SiN film 91. This causes deterioration of a wet etching rate (WER). The reason that NH, SiO, and $NH_2$ are present in the SiN film 91 as described above is that ions and radicals do not sufficiently reach the sidewalls of the recesses 90a, resulting in insufficient nitriding. As described above, the state of the SiN film 91, such as substances and chemical bonds contained in the SiN film 91, can be obtained from the difference data. For example, substances that affect quality of the SiN film 91, such as $NH_x$, $SiH_x$, and SiO, can be detected from the difference data.

The controller 60 displays the state of the SiN film 91 formed on the substrate W based on the difference data. For example, as shown in FIG. 9 and FIGS. 10A to 10C, the controller 60 displays the waveform L1 indicating the absorbance of the SiN film 91 for each wavenumber on the user interface 61. Further, the controller 60 specifies, for example, substances or chemical bonds contained in the SiN film 91 from the absorbance at the locations of the wavenumbers of the absorbed infrared light for respective substances or chemical bonds, and displays the specified substances or chemical bonds on the user interface 61. Furthermore, the controller 60 may estimate the thickness of the formed SiN film 91 from the absorbance at each wavenumber and may display the estimated film thickness on the user interface 61.

In addition, the controller 60 detects the chemical bonds contained in the SiN film 91 based on the difference data, and controls the process parameters according to the detected chemical bonds. For example, the controller 60 controls the process parameters for film formation so as to promote the nitriding process when the SiN film 91 is insufficiently nitrided as shown in FIGS. 10A to 10C. For example, the controller 60 controls the process parameters such that a flow rate of $NH_3$ gas supplied in the nitriding process increases and a nitriding time becomes longer. In this case, the film forming apparatus 100 can promote the nitriding process in subsequent film formation, thereby improving the quality of the SiN film 91 formed on the pattern 90.

In the present embodiment, the case where an FT-IR analysis is performed before and after forming the SiN film 91 has been described as an example, but the present disclosure is not limited thereto. The FT-IR analysis may be performed before and after a specific process in the plasma ALD method to acquire measurement data, respectively, and difference data in the specific process may be extracted. For example, the FT-IR analysis may be performed before and after the precursor adsorption process, the modification process, and the nitriding process in the plasma ALD method shown in FIG. 7 to acquire measurement data, respectively, and difference data may be extracted. In addition, the FT-IR analysis may be continuously performed during each of the processes, and difference between data before the corresponding process and real-time data may be monitored in real time. In this case, the states of the adsorption process, the modification process, and the nitriding process can be detected in real time from the difference data of the adsorption process, the modification process, and the nitriding process, respectively. For example, since a degree of adsorption of the precursor can be detected in the adsorption process, it is possible to detect whether or not a desired amount of the precursor is adsorbed in real time. In addition, since a degree of modification can be detected in the modification process, it is possible to detect whether or not desired modification is performed in real time. Furthermore, since a degree of nitriding can be detected in the nitriding process, it is possible to determine whether or not desired plasma nitriding is performed in real time. The controller 60 controls the process parameters based on the difference data. For example, as a result of detecting the states of adsorption, modification, and nitriding from the difference data in the adsorption process, the modification process, and the nitriding process, when the degree of the adsorption, modification, or nitriding is insufficient, the controller 60 controls the process parameters to perform the insufficient process. As a result, since the adsorption process, the modification process, and the nitriding process can be suppressed from being insufficiently performed, it is possible to improve the quality of the formed SiN film 91. In addition, when a process is performed for an unnecessarily long time, it is possible to shorten the process time to improve productivity. In addition, for example, by performing an FT-IR analysis before or after each process in the plasma ALD method shown in FIG. 7 to acquire measurement data, and by extracting difference data from the measurement data of the previous process, difference data of each process may be acquired. In this case, it is possible to detect the state of each process in real time from the difference data of the corresponding process.

As described above, the film forming method according to the embodiment includes a first measurement process (step S10), a film formation process (step S11), a second measurement process (step S12), and an extraction process (step S13). In the first measurement process, the substrate W on which the pattern 90 including the recesses 90*a* is formed is measured using infrared spectroscopy. In the film formation process, a film is formed on the substrate W after the first measurement process. The film formation process may include a modification process. In addition, the film formation process may be a modification process. In the second measurement process, the substrate W is measured using infrared spectroscopy after the film formation process. In the extraction process, difference data between the measurement data in the first measurement process and the measurement data in the second measurement process is extracted. Therefore, with the film forming method according to the embodiment, it is possible to detect the state of the film formed on the substrate W on which the pattern 90 including the recesses 90*a* is formed.

Further, in the extraction process, the absorbance of infrared light at each wavenumber is obtained from the measurement data before film formation in the first measurement process and the measurement data after film formation in the second measurement process. In the extraction process, the absorbance of infrared light at each wavenumber by the film is extracted as the difference data by subtracting the absorbance of infrared light before film formation from the absorbance of infrared light after film formation for each wavenumber. Thus, with the film forming method according to the embodiment, it is possible to detect the state of the film formed on the substrate W from the absorbance of infrared light at each wavenumber extracted as the difference data.

The film forming method according to the embodiment further includes a display process (step S14) of displaying the state of the film formed on the substrate W in the film formation process based on the difference data extracted in the extraction process. Thus, with the film forming method according to the embodiment, it is possible to provide the state of the film actually formed on the substrate W to a process manager.

The film forming method according to the embodiment further includes a control process (step S15) of controlling the process parameters of the film formation process based on the difference data extracted in the extraction process. Thus, with the film forming method according to the embodiment, it is possible to adjust the process parameters according to the state of the film actually formed on the substrate W, and to improve the quality of the film formed on the substrate W in a subsequent film formation process.

Although embodiments have been described above, it should be considered that the embodiments disclosed herein are illustrative and are not restrictive in all respects. Indeed, the embodiments described above can be implemented in various forms. In addition, the embodiments described above may be omitted, replaced, or modified in various forms without departing from the scope and spirit of the claims.

For example, in the embodiments described above, the case where infrared light is reflected from the vicinity of the center of the substrate W to detect the state of the film formed in the vicinity of the center of the substrate W has been described, but the present disclosure is not limited thereto. For example, optical elements, such as a mirror that reflects infrared light and a lens, may be provided in the chamber 1, and a plurality of locations, such as the vicinities of the center and periphery of the substrate W, may be irradiated with infrared light by the optical elements, whereby the state of the film at each of the plurality of locations on the substrate W may be detected by detecting the infrared light reflected from each of the plurality of locations. For example, before and after film formation, an FT-IR analysis is performed on a plurality of in-plane locations of the substrate W to acquire measurement data. The controller 60 extracts, for each of the plurality of locations, difference data between the measurement data before film formation and the measurement data after film formation. The controller 60 controls the process parameters based on the extracted difference data at the plurality of locations. For example, the controller 60 controls the process parameters for film formation so as to promote the nitriding process when the SiN film 91 is insufficiently nitrided at any location. The controller 60 may estimate film thicknesses at the plurality of locations on the substrate W based on the difference data at the plurality of locations, and may detect a film thickness distribution. In addition, the controller 60 may control the process parameters so as to obtain a predetermined film quality while making the film thickness distribution uniform. For example, when the film thickness distribution of the SiN film 91 is non-uniform and the SiN film 91 is insufficiently nitrided at any location, the controller 60 controls the process parameters for film formation so as to promote the nitriding process while making the film thickness distribution of the SiN film 91 uniform.

In the embodiments described above, the case where the process parameters for film formation are controlled from the difference data of one substrate W has been described as an example, but the present disclosure is not limited thereto. The process parameters in the film formation process may be controlled based on a comparison result of difference data among a plurality of substrates W from the difference data of the plurality of substrates W. For example, in the film forming apparatus 100, when the film formation process is performed on a plurality of substrates W, states of formed films may change due to a temporal change or the like. The controller 60 changes the process parameters of the film formation process so as to suppress the change in the states of the films based on the comparison result of the difference data among the substrates W. For example, the controller 60 controls the process parameters for film formation so as to promote the nitriding process when the SiN film 91 is insufficiently nitrided. Thus, it possible to suppress the change in the states of the films formed on the plurality of substrates W.

In the embodiments described above, the case where the process parameters for film formation are controlled from the difference data of one substrate W has been described as an example, but the present disclosure is not limited thereto. Conditions of the film forming apparatus 100 may change temporally, and states of formed films may change even when the films are formed under the same film formation conditions (recipe). Therefore, the film forming apparatus 100 may periodically, for example, every few days or every predetermined timing, perform the film formation process under the same film formation conditions, and may perform an FT-IR analysis before and after film formation, thereby diagnosing the conditions of the film forming apparatus 100 based on the result of the FT-IR analysis. For example, the film forming apparatus 100 periodically forms films on a plurality of substrates W under the same film formation conditions. The controller 60 diagnoses the conditions of the film forming apparatus 100 based on the comparison result of difference data among the plurality of substrates from the difference data of the plurality of substrates W, on each of which a film was formed under the same film formation conditions. Therefore, it is possible to detect a change in the conditions of the film forming apparatus 100 from a change in the states of the films formed under the same film formation conditions.

In the embodiments described above, the case where the film forming apparatus of the present disclosure is a single chamber type film forming apparatus 100 having one chamber has been described as an example, but the present disclosure is not limited thereto. The film forming apparatus of the present disclosure may be a multi-chamber type film forming apparatus having a plurality of chambers.

Figure 11:
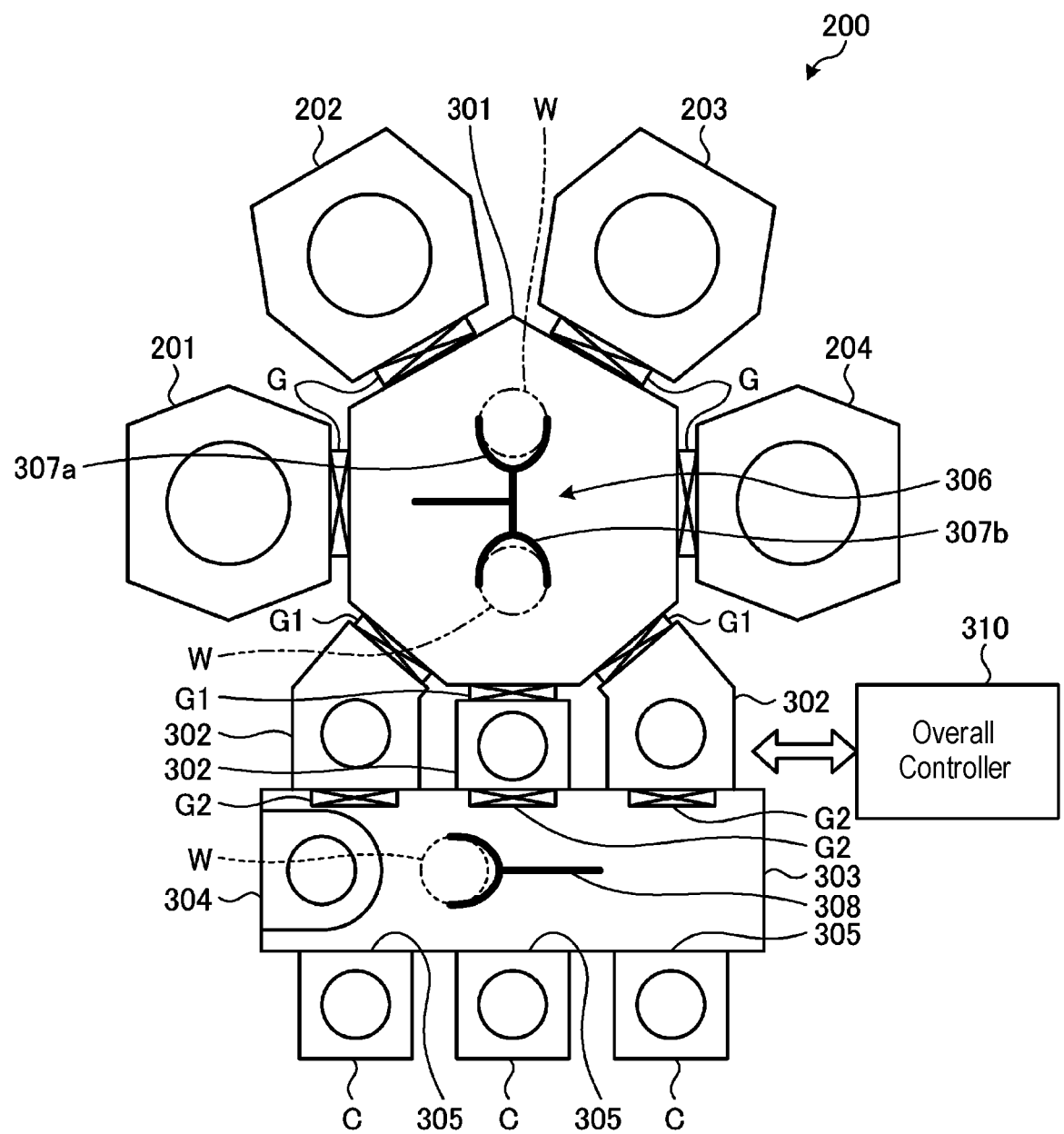
FIG. 11 is a schematic configuration view illustrating another exemplary film forming apparatus according to an embodiment.

FIG. 11 is a view schematically illustrating a configuration of another exemplary film forming apparatus 200 according to an embodiment. As illustrated in FIG. 11, the film forming apparatus 200 is a multi-chamber type film forming apparatus having four chambers 201 to 204. In the film forming apparatus 200, a plasma ALD process is performed in each of the four chambers 201 to 204.

The chambers 201 to 204 are connected to four walls of a vacuum transfer chamber 301 having a heptagonal shape in a plan view via gate valves G, respectively. The interior of the vacuum transfer chamber 301 is evacuated by a vacuum pump, and is maintained at a predetermined degree of vacuum. Three load-lock chambers 302 are connected to the other three walls of the vacuum transfer chamber 301 via gate valves G1. An atmospheric transfer chamber 303 is provided on a side opposite the vacuum chamber 301, with the load-lock chambers 302 interposed therebetween. The three load-lock chambers 302 are connected to the atmospheric transfer chamber 303 via gate valves G2, respectively. The load-lock chambers 302 perform a pressure control between atmospheric pressure and vacuum when a substrate W is transferred between the atmospheric transfer chamber 303 and the vacuum transfer chamber 301.

Three carrier installation ports 305, in each of which a carrier (an FOUP or the like) C for accommodating substrates W is installed, are provided on a wall of the atmospheric transfer chamber 303 opposite to the wall of the atmosphere transfer chamber 303 on which the load-lock chambers 302 are installed. In addition, an alignment chamber 304 for aligning a substrate W is provided on a sidewall of the atmospheric transfer chamber 303. The atmospheric transfer chamber 303 is configured to form a downflow of clean air therein.

In the vacuum transfer chamber 301, a transfer mechanism 306 is provided. The transfer mechanism 306 transfers a substrate W among the chambers 201 to 204 and the load-lock chambers 302. The transfer mechanism 306 has two independently movable transfer arms 307a and 307b.

In the atmospheric transfer chamber 303, a transfer mechanism 308 is provided. The transfer mechanism 308 is configured to transfer a substrate W among the carriers C, the load-lock chambers 302, and the alignment chamber 304.

The film forming apparatus 200 has a controller 310. Operations of the film forming apparatus 200 are controlled overall by the controller 310.

In the film forming apparatus 200 configured as described above, a measurement part that measures a substrate W using infrared spectroscopy may be provided at a location other than the chambers 201 to 204. For example, the film forming apparatus 200 may include a measurement part configured to measure the substrate W using infrared spectroscopy in the vacuum transfer chamber 301 or any of the load-lock chambers 302. For example, in the measurement part, an emitter configured to emit infrared light and a detector configured to detect the infrared light are arranged in a vertical direction. When performing an FT-IR analysis in the film forming apparatus 200, the substrate W is disposed in the measurement part by the transfer mechanism 306. In the measurement part, infrared light is emitted to the substrate W, and the detector detects the infrared light transmitted through the substrate W.

The controller 310 measures the substrate W before film formation using the measurement part. The controller 310 forms a film on the substrate W using any of the chambers 201 to 204. The controller 310 measures the substrate W after film formation using the measurement part. The controller 310 extracts difference data between the measurement data obtained before film formation using the measurement part and the measurement data obtained after film formation using the measurement part. Thus, the film forming apparatus 200 can also detect a state of the film formed on the substrate W on which a pattern including recesses is formed.

As described above, an example of detecting a state of a film in a film formation process by applying the technique of the present disclosure has been described, but the present disclosure is not limited thereto. The process in which the state of the film is detected is not limited to the film formation process, but may be any process related to semiconductor manufacturing processes of manufacturing a semiconductor device, such as an etching process and a resist process, or may be a plurality of processes including a combination of any processes. In addition, from the viewpoint of any process related to the semiconductor manufacturing processes and/or a plurality of processes including a combination thereof, the technique of the present disclosure may be applied for in-process or inter-process diagnosis or monitoring by applying the technique of the present disclosure before and after any process or a plurality of processes. For example, the technique may be applied to various triggers (e.g., particles or at least one of an in-plane distribution and inter-plane distribution) related to productivity in semiconductor manufacturing (e.g., availability or yield). In addition, as described above, as the film forming apparatus of the present disclosure, a single chamber type film forming apparatus and a multi-chamber type film forming apparatus having multiple chambers have been described as an example, but the present disclosure is not limited thereto. For example, the film forming apparatus may be a batch type film forming apparatus capable of processing a plurality of substrates at once, or a carousel type semi-batch type film forming apparatus.

According to the present disclosure, it is possible to detect a state of a film formed on a substrate W on which a pattern including recesses is formed.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method comprising:
   a first measurement process of measuring a substrate on which a pattern including recesses is formed using infrared spectroscopy;
   a film formation process of forming a film on the substrate after the first measurement process;
   a second measurement process of measuring the substrate using infrared spectroscopy after the film formation process; and
   an extraction process of extracting difference data between measurement data obtained in the first measurement process and measurement data obtained in the second measurement process.

2. The film forming method of claim 1, wherein the extraction process further includes:
   obtaining an absorbance of infrared light before film formation and an absorbance of infrared light after film formation for each wavenumber of infrared light from the measurement data before film formation obtained in the first measurement process and the measurement data after film formation obtained in the second measurement process, respectively; and
   extracting an absorbance of infrared light at each wavenumber as the difference data by subtracting the absorbance of infrared light before film formation from the absorbance of infrared light after film formation for each wavenumber of infrared light.

3. The film forming method of claim 2, further comprising:
   a display process of displaying a state of the film formed on the substrate in the film formation process based on the difference data extracted in the extraction process.

4. The film forming method of claim 3, further comprising:
   a control process of controlling process parameters in the film formation process based on the difference data extracted in the extraction process.

5. The film forming method of claim 4, wherein the control process further includes controlling the process parameters in the film formation process based on a comparison result of difference data among a plurality of substrates from the difference data of the plurality of substrates.

6. The film forming method of claim 5, wherein the film formation process further includes periodically forming a film on a substrate under same film formation conditions, and
   wherein the film forming method further comprises a diagnosis process of diagnosing conditions of an apparatus that performs the film formation process based on a comparison result of difference data among a plurality of substrates obtained from the difference data of the plurality of substrates on each of which the film has been formed under the same film formation conditions.

7. The film forming method of claim 1, further comprising:
   a display process of displaying a state of the film formed on the substrate in the film formation process based on the difference data extracted in the extraction process.

8. The film forming method of claim 1, further comprising:
   a control process of controlling process parameters in the film formation process based on the difference data extracted in the extraction process.

9. The film forming method of claim 8, wherein the control process further includes controlling the process parameters in the film formation process based on a comparison result of difference data among a plurality of substrates from the difference data of the plurality of substrates.

10. The film forming method of claim 8, wherein each of the first measurement process and the second measurement process is carried out on a plurality of in-plane locations of the substrate, and
    wherein the control process further includes:
      extracting difference data between the measurement data obtained in the first measurement process and the measurement data obtained in the second measurement process for each of the plurality of locations; and
      controlling the process parameters based on the extracted difference data of the plurality of locations.

11. The film forming method of claim 10, wherein the control process further includes:
    obtaining a film thickness distribution and film quality of the film formed on the substrate from the difference data of the plurality of locations; and
    controlling the process parameters such that predetermined film quality is obtained while making the film thickness distribution uniform.

12. The film forming method of claim 1, wherein the film formation process further includes periodically forming a film on a substrate under same film formation conditions, and
    wherein the film forming method further comprises a diagnosis process of diagnosing conditions of an apparatus that performs the film formation process based on a comparison result of difference data among a plurality of substrates obtained from the difference data of the plurality of substrates on each of which the film has been formed under the same film formation conditions.

13. A film forming apparatus comprising:
    a stage configured to place thereon a substrate on which a pattern including recesses is formed;
    a film formation part configured to perform a film formation process on the substrate;
    a measurement part configured to measure the substrate using infrared spectroscopy; and
    a controller configured to:

measure the substrate before film formation by the measurement part;

form a film on the substrate by the film formation part;

measure the substrate after film formation by the measurement part; and perform a control to extract difference data between measurement data obtained by the measurement part before the film is formed and measurement data obtained by the measurement part after the film is formed.

* * * * *